(12) United States Patent
Choi et al.

(10) Patent No.: US 12,396,335 B2
(45) Date of Patent: Aug. 19, 2025

(54) FOLDABLE DISPLAY DEVICE

(71) Applicant: LG DISPLAY CO., LTD., Seoul (KR)

(72) Inventors: Kwang-Hyun Choi, Paju-si (KR); Min-Jic Lee, Paju-si (KR); Ye-Seul Han, Paju-si (KR); Jeong-Ok Jo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 487 days.

(21) Appl. No.: 17/976,632

(22) Filed: Oct. 28, 2022

(65) Prior Publication Data

US 2023/0200153 A1 Jun. 22, 2023

(30) Foreign Application Priority Data

Dec. 16, 2021 (KR) .................. 10-2021-0180260

(51) Int. Cl.
| | | |
|---|---|---|
| *H10K 59/126* | (2023.01) | |
| *H10K 50/86* | (2023.01) | |
| *H10K 77/10* | (2023.01) | |
| *H10K 102/00* | (2023.01) | |

(52) U.S. Cl.
CPC .......... *H10K 59/126* (2023.02); *H10K 50/86* (2023.02); *H10K 77/111* (2023.02); *H10K 2102/311* (2023.02)

(58) Field of Classification Search
CPC .... H10K 59/126; H10K 50/86; H10K 77/111; H10K 2102/311
See application file for complete search history.

(56) References Cited

U.S. PATENT DOCUMENTS

| | | | |
|---|---|---|---|
| 11,048,295 B1* | 6/2021 | Smeeton | G09F 9/301 |
| 2011/0248279 A1 | 10/2011 | Park et al. | |
| 2015/0187959 A1 | 7/2015 | Yoon | |
| 2015/0382446 A1* | 12/2015 | Kwon | G06F 1/1643 |
| | | | 174/251 |
| 2016/0014881 A1* | 1/2016 | Shin | G06F 1/1616 |
| | | | 361/749 |
| 2016/0357052 A1* | 12/2016 | Kim | H10K 59/87 |
| 2017/0153668 A1* | 6/2017 | Jang | G06F 1/1641 |
| 2017/0278900 A1* | 9/2017 | Yang | G06F 1/1652 |
| 2018/0108852 A1 | 4/2018 | Nishikawa | |
| 2019/0088684 A1 | 3/2019 | Yu et al. | |
| 2019/0204867 A1* | 7/2019 | Song | G06F 1/1641 |
| 2019/0334114 A1* | 10/2019 | Park | G06F 1/203 |

(Continued)

FOREIGN PATENT DOCUMENTS

| | | |
|---|---|---|
| JP | 2018063383 A | 4/2018 |
| KR | 10-2011-0114089 A | 10/2011 |

(Continued)

OTHER PUBLICATIONS

Office Action dated Nov. 30, 2024 issued in Korean Patent Application No. 10-2021-0180260.

*Primary Examiner* — Mohsen Ahmadi
(74) *Attorney, Agent, or Firm* — Morgan, Lewis & Bockius LLP

(57) ABSTRACT

A foldable display device includes a display panel including a plurality of sub-pixels and having a first shield pattern in a non-folding region and a second shield pattern in a folding region; a cover window over the display panel, wherein an area of the second shield pattern is larger than an area of the first shield pattern.

14 Claims, 12 Drawing Sheets

(56) References Cited

U.S. PATENT DOCUMENTS

| | | | |
|---|---|---|---|
| 2020/0225699 A1* | 7/2020 | Yu | G06F 1/1652 |
| 2020/0266259 A1 | 8/2020 | Lee et al. | |
| 2021/0173437 A1* | 6/2021 | Bae | G06F 1/1616 |
| 2021/0295006 A1 | 9/2021 | Ryu et al. | |
| 2021/0397221 A1* | 12/2021 | Hwang | G06F 3/0416 |
| 2023/0040833 A1* | 2/2023 | Park | H10K 59/40 |

FOREIGN PATENT DOCUMENTS

| | | |
|---|---|---|
| KR | 10-2015-0075687 A | 7/2015 |
| KR | 20160144912 A | 12/2016 |
| KR | 10-2017-0080307 A | 7/2017 |
| KR | 10-2017-0081116 A | 7/2017 |
| KR | 20180008204 A | 1/2018 |
| KR | 10-2020-0055772 A | 5/2020 |
| KR | 10-2020-0100890 A | 8/2020 |
| KR | 20210118301 A | 9/2021 |

* cited by examiner

FOLDABLE DISPLAY DEVICE

CROSS-REFERENCE TO RELATED APPLICATION

The present application claims the priority of Korean Patent Application No. 10-2021-0180260 filed on Dec. 16, 2021, which is hereby incorporated by reference in its entirety.

BACKGROUND

Technical Field

The present disclosure relates to a foldable display device, and more particularly, to a foldable display device with improved durability.

Discussion of the Related Art

An electroluminescent display device, which is one of flat panel display devices, has a wide viewing angle as compared with a liquid crystal display device because it is self-luminous and is thin, light weight, and low in power consumption because a backlight unit is not necessary. In addition, an electroluminescent display device is driven by low voltages of direct current (DC) and has a fast response time. An electroluminescent display device is also resistant to external impacts and may be used in a wide range of temperatures because its components are solids. An electroluminescent display device may also be manufactured at low cost.

Recently, a foldable display device, which can be freely folded and unfolded by forming components of the electroluminescent display device on a flexible substrate, has been widely developed and applied to various fields.

The foldable display device is in an unfolded state when displaying an image to provide a wide screen and is in a folded state when not displaying an image to reduce the volume, thereby having advantages of convenient transportation and/or storage.

By the way, since the foldable display device is repeatedly folded and unfolded more than tens of thousands of times, improving durability is emerging as an important issue.

SUMMARY

Accordingly, embodiments of the present disclosure are directed to a foldable display device that substantially obviates one or more of the problems due to limitations and disadvantages described above.

An aspect of the present disclosure is to provide a foldable display device with the improved durability.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the present disclosure, as embodied and broadly described herein, a foldable display device comprises a display panel including a plurality of sub-pixels and having a first shield pattern in a non-folding region and a second shield pattern in a folding region; a cover window over the display panel, wherein an area of the second shield pattern is larger than an area of the first shield pattern.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure. In the drawings.

DETAILED DESCRIPTION

Reference will now be made in detail to aspects of the disclosure, an example embodiments of which are illustrated in the accompanying drawings.

Figure 1:
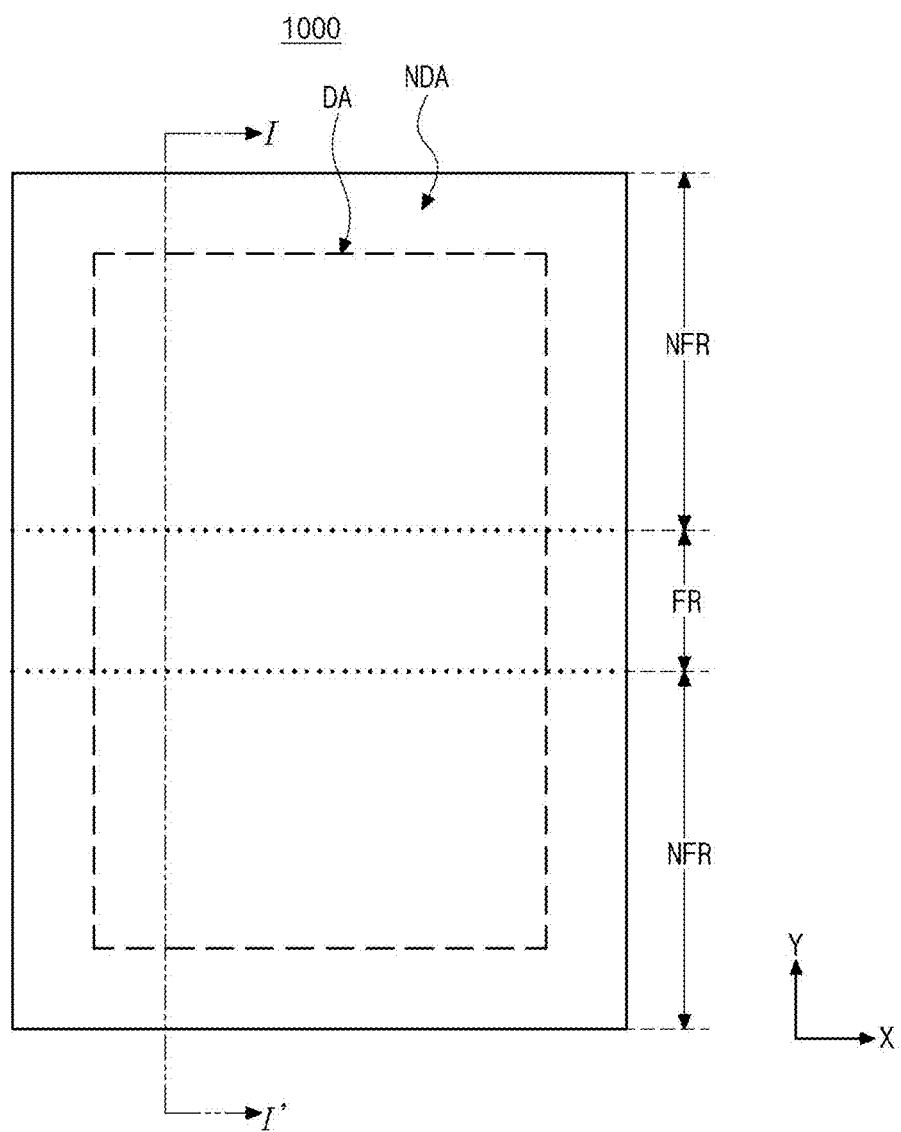
FIG. 1 is a schematic plan view of a foldable display device according to an embodiment of the present disclosure.
Figure 2:
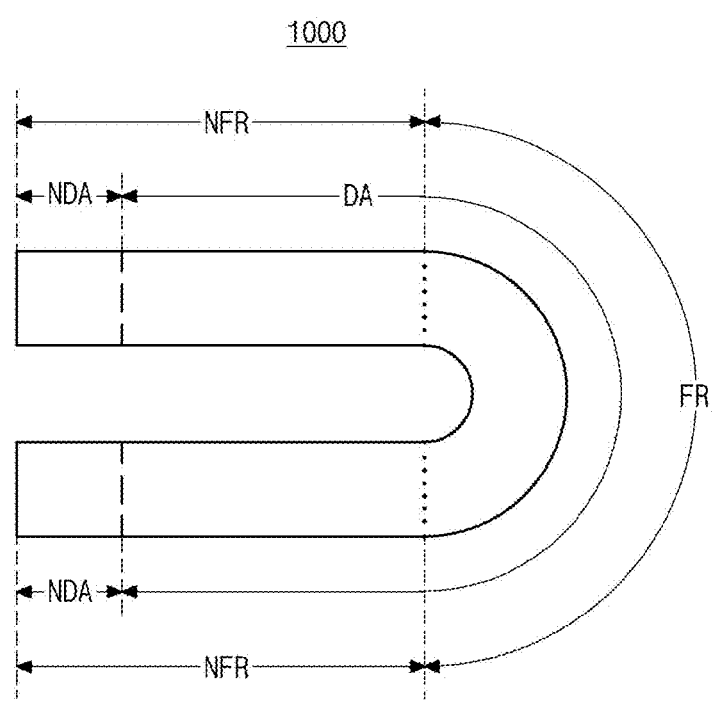
FIG. 2 is a schematic cross-sectional view of the foldable display device according to the embodiment of the present disclosure.

FIG. 1 is a schematic plan view of a foldable display device according to an embodiment of the present disclosure and shows an unfolded state, and FIG. 2 is a schematic cross-sectional view of the foldable display device according to the embodiment of the present disclosure and shows a folded state.

In FIG. 1 and FIG. 2, the foldable display device 1000 according to the embodiment of the present disclosure includes a folding region FR and a non-folding region NFR and is folded in a first direction (e.g., a Y-axis direction).

Specifically, the foldable display device 1000 according to the embodiment of the present disclosure includes respective non-folding regions NFR at both sides of the folding region FR facing each other along the first direction (e.g., the Y-axis direction) such that one folding region FR is disposed between two non-folding regions NFR along the first direction (e.g., the Y-axis direction).

In addition, the foldable display device 1000 includes a display area DA displaying an image and a non-display area NDA surrounding the display area DA. A plurality of sub-pixels is disposed in the display area DA to implement an image. Pads, signal lines, and driving parts are disposed in the non-display area NDA to provide signals to the plurality of sub-pixels.

When implementing the folding state, the foldable display device 1000 of the present disclosure can be out-folded in which a display surface is exposed to the outside. However, the present disclosure is not limited thereto. Alternatively, the foldable display device 1000 of the present disclosure can be in-folded in which the display surface is hidden inside.

Figure 3:
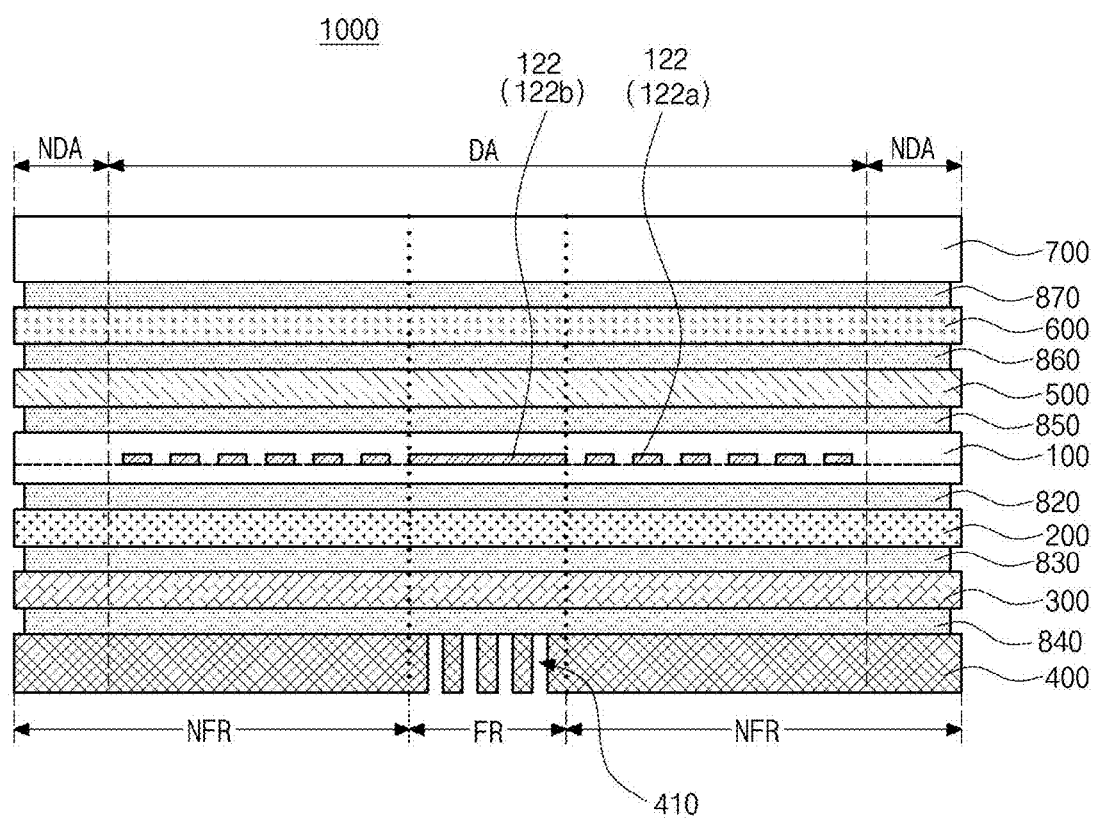
FIG. 3 is a schematic cross-sectional view corresponding to the line I-I'.

FIG. 3 is a schematic cross-sectional view of the foldable display device according to the embodiment of the present disclosure and shows the cross-section corresponding to the line I-I'.

In FIG. 3, the foldable display device 1000 according to the embodiment of the present disclosure includes a display panel 100, a back plate 200, a plate top 300, a plate bottom 400, a polarizing plate 500, a decoration film 600, and a cover window 700.

The display panel 100 includes the plurality of sub-pixels in the display area DA and displays an image. The display panel 100 of the present disclosure can be an organic light-emitting diode panel.

Meanwhile, a shield pattern 122 is formed in the display area DA of the display panel 100. The shield pattern 122 includes at least one first shield pattern 122a disposed in the non-folding region NFR and at least one second shield pattern 122b disposed in the folding region FR.

Here, the area of the at least one second shield pattern 122b is larger than the area of the at least one first shield pattern 122a. More particularly, the first shield pattern 122a can be formed to correspond to each sub-pixel, and the plurality of first shield patterns 122a can be disposed in the non-folding region NFR. On the other hand, the second shield pattern 122b can be formed over substantially an entire surface of the folding region FR, and one second shield pattern 122b can be disposed in the folding region FR.

The first and second shield patterns 122a and 122b will be described in detail later.

Meanwhile, to improve the durability and maintain the shape of the foldable display device 1000, the back plate 200, the plate top 300, and the plate bottom 400 are provided under the display panel 100 and are sequentially disposed from the bottom surface of the display panel 100.

The back plate 200 can be formed of an organic material having excellent molding characteristics. For example, the back plate 200 can be formed of polyimide, but is not limited thereto.

The plate top 300 and the plate bottom 400 can be formed of a metal material. The thickness of the plate bottom 400, which is exposed to the outside, can be thicker than the thickness of the plate top 300. For example, the plate top 300 can be formed of SUS301 having relatively high hardness, and the plate bottom 400 can be formed of SUS316 having relatively high corrosion resistance and acid resistance. However, the present disclosure is not limited thereto.

To improve the folding characteristics, the plate bottom 400 can include a plurality of openings 410 in the folding region FR. The plurality of openings 410 can be provided to penetrate upper and lower surfaces of the plate bottom 400.

Next, the polarizing plate 500 is disposed on the display panel 100. The polarizing plate 500 can be a circular polarizing plate including a linear polarizer and a quarter wave plate and can prevent the external light from being reflected by the display panel 100 and output to the outside.

The decoration film 600 is disposed on the polarizing plate 500. The decoration film 600 can serve as a black matrix that blocks light in an undesired area.

The cover window 700 is disposed on the decoration film 600. The cover window 700 protects the display panel 100 from impacts, moisture, or heat from the outside and can be formed of transparent glass or plastic. For example, the cover window 700 can be formed of plastic such as polymethylmethacrylate (PMMA), polyimide (PI), or polyethyleneterephthalate (PET) or formed of ultra-thin glass (UTG), but is not limited thereto.

First, second, third, fourth, fifth, and sixth adhesive members 820, 830, 840, 850, 860, and 870 are provided between adjacent components of the display panel 100, the back plate 200, the plate top 300, the plate bottom 400, the polarizing plate 500, the decoration film 600, and the cover window 700.

Specifically, the first adhesive member 820 is provided between the display panel 100 and the back plate 200, the second adhesive member 830 is provided between the back plate 200 and the plate top 300, the third adhesive member 840 is provided between the plate top 300 and the plate bottom 400, the fourth adhesive member 850 is provided between the display panel 100 and the polarizing plate 500, the fifth adhesive member 860 is provided between the polarizing plate 500 and the decoration film 600, and the sixth adhesive member 870 is provided between the decoration film 600 and the cover window 700.

The first, second, third, fourth, fifth, and sixth adhesive members 820, 830, 840, 850, 860, and 870 can be optically clear adhesive (OCA) or pressure sensitive adhesive (PSA).

As described above, in the foldable display device 1000 according to the embodiment of the present disclosure, to improve the durability and maintain the shape, the back plate 200, the plate top 300, and the plate bottom 400 are provided under the display panel 100.

In this case, in order to improve the folding characteristics of the plate bottom 400 that is relatively thick and formed of a metal material, the plurality of openings 410 is formed in the folding region FR of the plate bottom 400.

By the way, the durability of the folding region FR can be lower than the non-folding region NFR due to the openings 410. For example, when evaluating the impact resistance, the durability of the folding region FR is reduced to about ½ or less compared to the non-folding region NFR.

Accordingly, the durability can be improved by forming the second shield pattern 122b over substantially the entire surface of the folding region FR of the display panel 100.

The configurations of the display panel 100 and the plate bottom 400 will be described in detail with reference to FIGS. 4 to 6.

Figure 4:
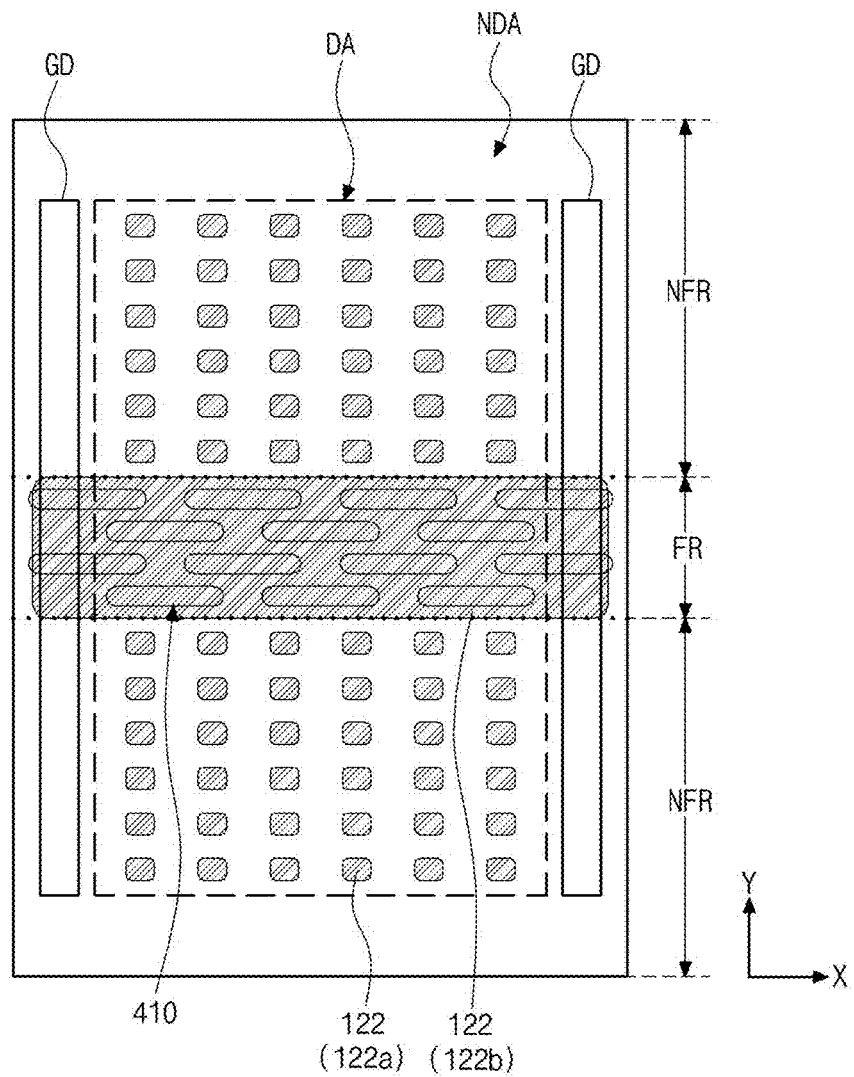
FIG. 4 is a plan view schematically illustrating the display panel and the plate bottom of the foldable display device according to the embodiment of the present disclosure.
Figure 5:
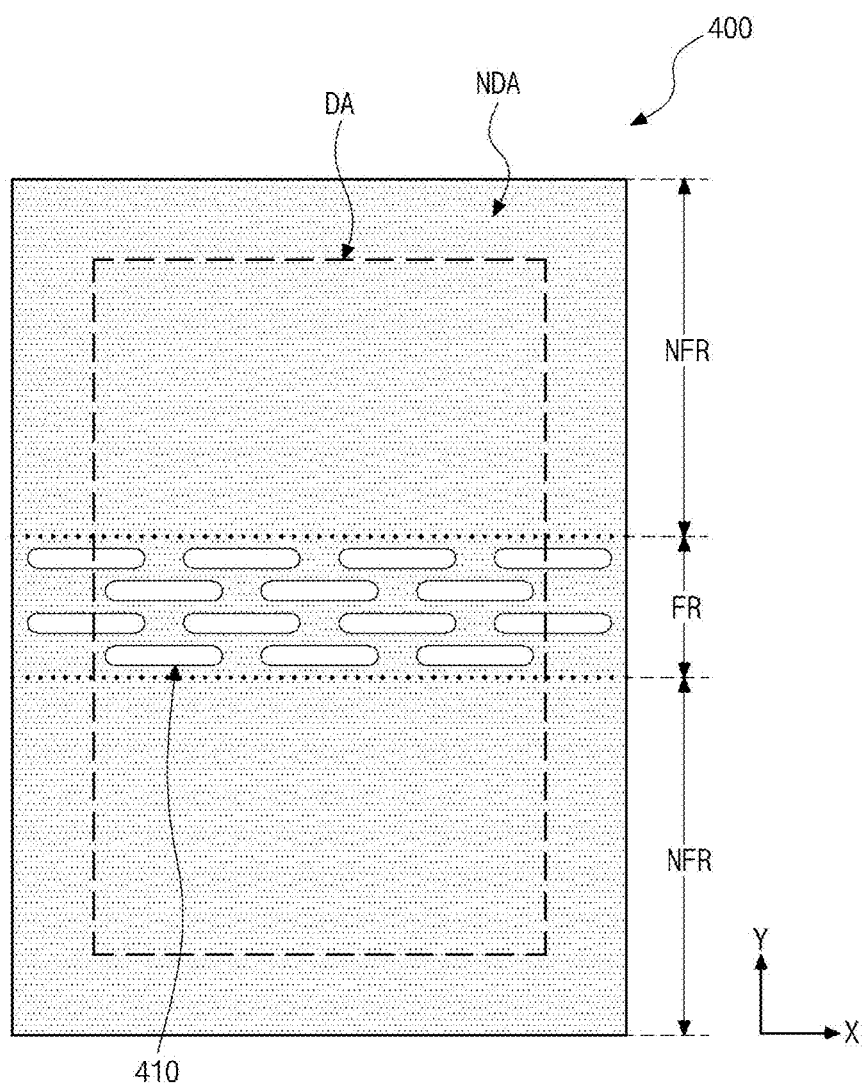
FIG. 5 is a plan view schematically illustrating the plate bottom of the foldable display device according to the embodiment of the present disclosure.
Figure 6:
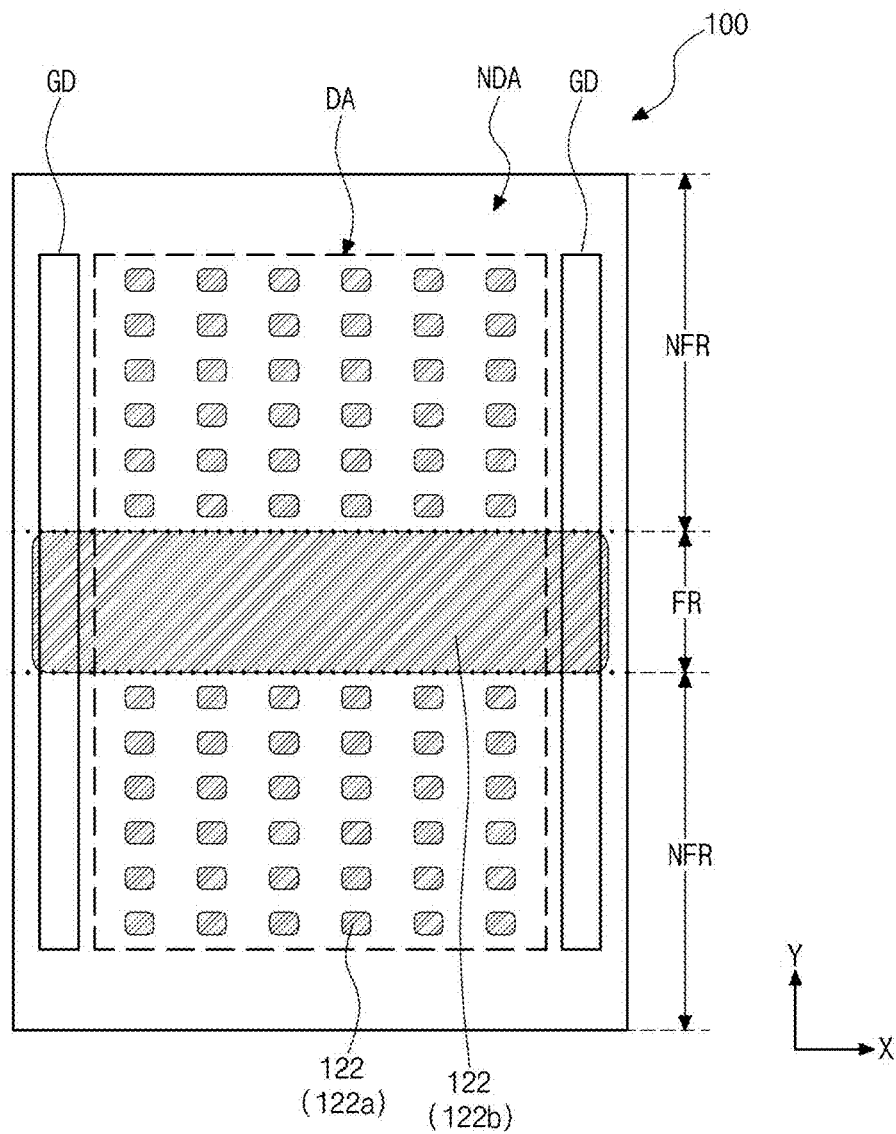
FIG. 6 is a plan view schematically illustrating the display panel of the foldable display device according to the embodiment of the present disclosure.

FIG. 4 is a plan view schematically illustrating the display panel and the plate bottom of the foldable display device according to the embodiment of the present disclosure, FIG. 5 is a plan view schematically illustrating the plate bottom of the foldable display device according to the embodiment of the present disclosure, and FIG. 6 is a plan view schematically illustrating the display panel of the foldable display device according to the embodiment of the present disclosure.

In FIGS. 4 to 6, the plate bottom 400 of the foldable display device according to the embodiment of the present disclosure includes the plurality of openings 410 in the folding region FR.

The openings 410 each have a length of a direction perpendicular to a folding direction longer than a length of the folding direction. That is, each of the openings 410 has a length of a second direction (e.g., an X-axis direction) longer than a length of the first direction (e.g., the Y-axis direction). In other words, a length of a respective opening 410 in the second direction (e.g., the X-axis direction) is longer than a length of the opening 410 in the first direction (e.g., the Y-axis direction).

The openings 410 can be formed to extend from the display area DA to the non-display area NDA and formed not only in the display area DA but also in the non-display area.

Here, the shapes and numbers of the openings 410 are not limited to those illustrated and can be changed.

Next, the display panel 100 includes the shield pattern 122 in the display area DA. The shield pattern 122 includes the plurality of first shield patterns 122a in the non-folding region NFR and one second shield pattern 122b in the folding region FR.

Here, the second shield pattern 122b overlaps the plurality of openings 410.

The plurality of first shield patterns 122a is formed to correspond to the plurality of sub-pixels, respectively. On the other hand, the second shield pattern 122b is formed over substantially the entire surface of the folding region FR and corresponds to all the sub-pixels of the folding region FR. The area of the second shield pattern 122b is larger than the area of each of the first shield patterns 122a. In addition, the display panel 100 includes at least one gate driving part GD in the non-display area NDA. In this case, the gate driving part GD can extend along the first direction (e.g., the Y-axis direction) and can be disposed in the folding region FR and the non-folding region NFR. Further, the gate driving part GD can be disposed in each of two portions of the non-display area NDA facing each other along the second direction (e.g., the X-axis direction).

The gate driving part GD can include a plurality of transistors, capacitors, and lines and can be provided on a substrate of the display panel 100 in the form of a gate-in-panel.

At this time, the second shield pattern 122b can extend into the non-display area NDA and can overlaps the gate driving part GD.

Meanwhile, the plurality of openings 410 can overlap the gate driving part GD.

As described above, in the foldable display device according to the embodiment of the present disclosure, the second shield pattern 122b is provided over substantially the entire surface of the folding region FR of the display panel 100, so that the durability can be improved.

Meanwhile, if the first shield pattern 122a is formed over the entire surface of the non-folding region NFR, the durability of the foldable display device can be further improved. However, in this case, the parasitic capacitance of the data line or the like increases, and the driving characteristics are degraded Accordingly, the shield pattern 122 is differently designed in the folding region FR and the non-folding region NFR. That is, in the folding region FR, the second shield pattern 122b is formed over substantially the entire surface, and the second shield pattern 122b is formed in entirety of each sub-pixel. On the other hand, the first shield pattern 122a is formed only in a portion of each sub-pixel.

The configurations of the sub-pixels of the display panel according to the embodiment of the present disclosure will be described with reference to FIGS. 7 to 10.

Figure 7:
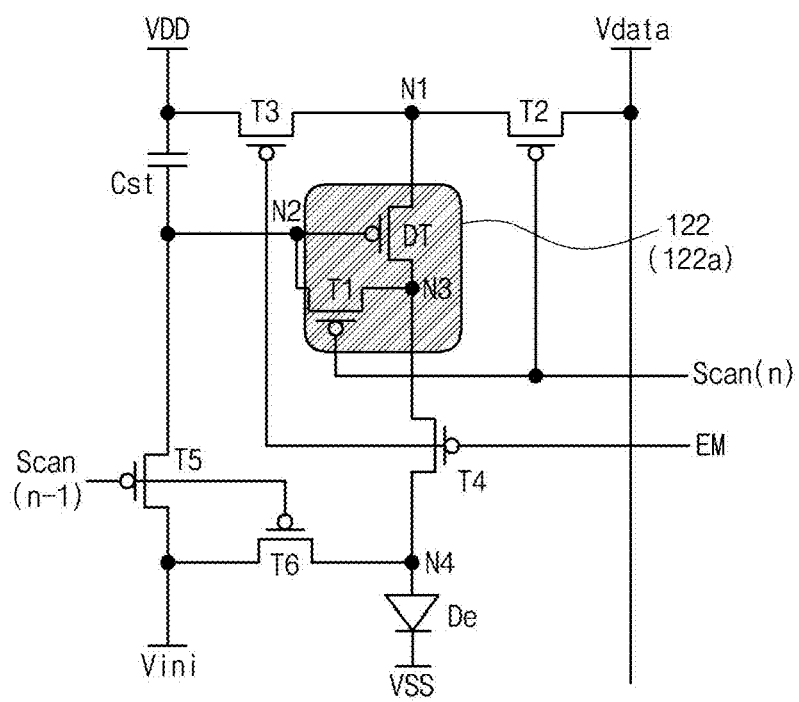
FIG. 7 is a circuit diagram illustrating a sub-pixel of the display panel in the non-folding region of the foldable display device according to the embodiment of the present disclosure.
Figure 8:
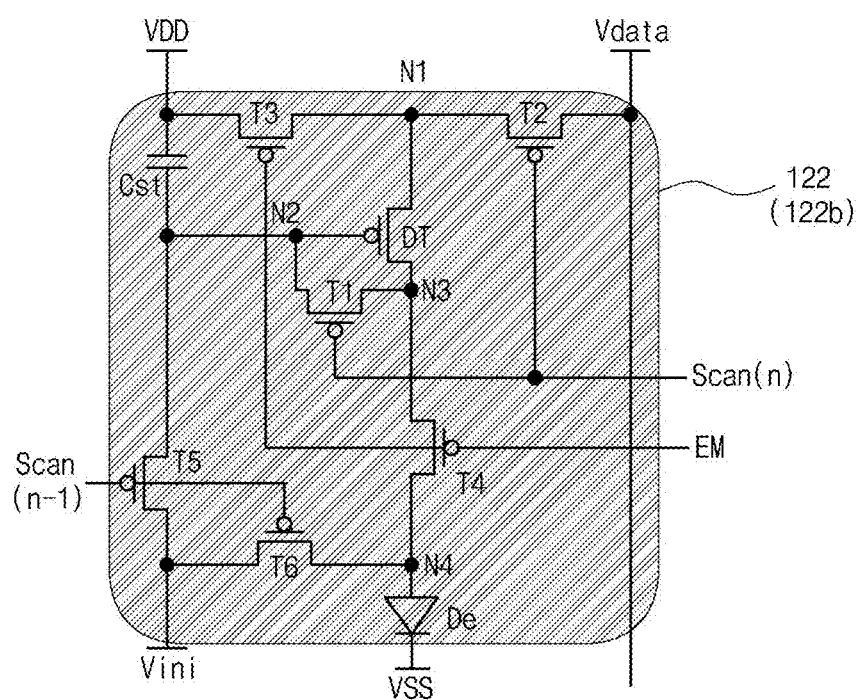
FIG. 8 is a circuit diagram illustrating a sub-pixel of the display panel in the folding region of the foldable display device according to the embodiment of the present disclosure.
Figure 9:
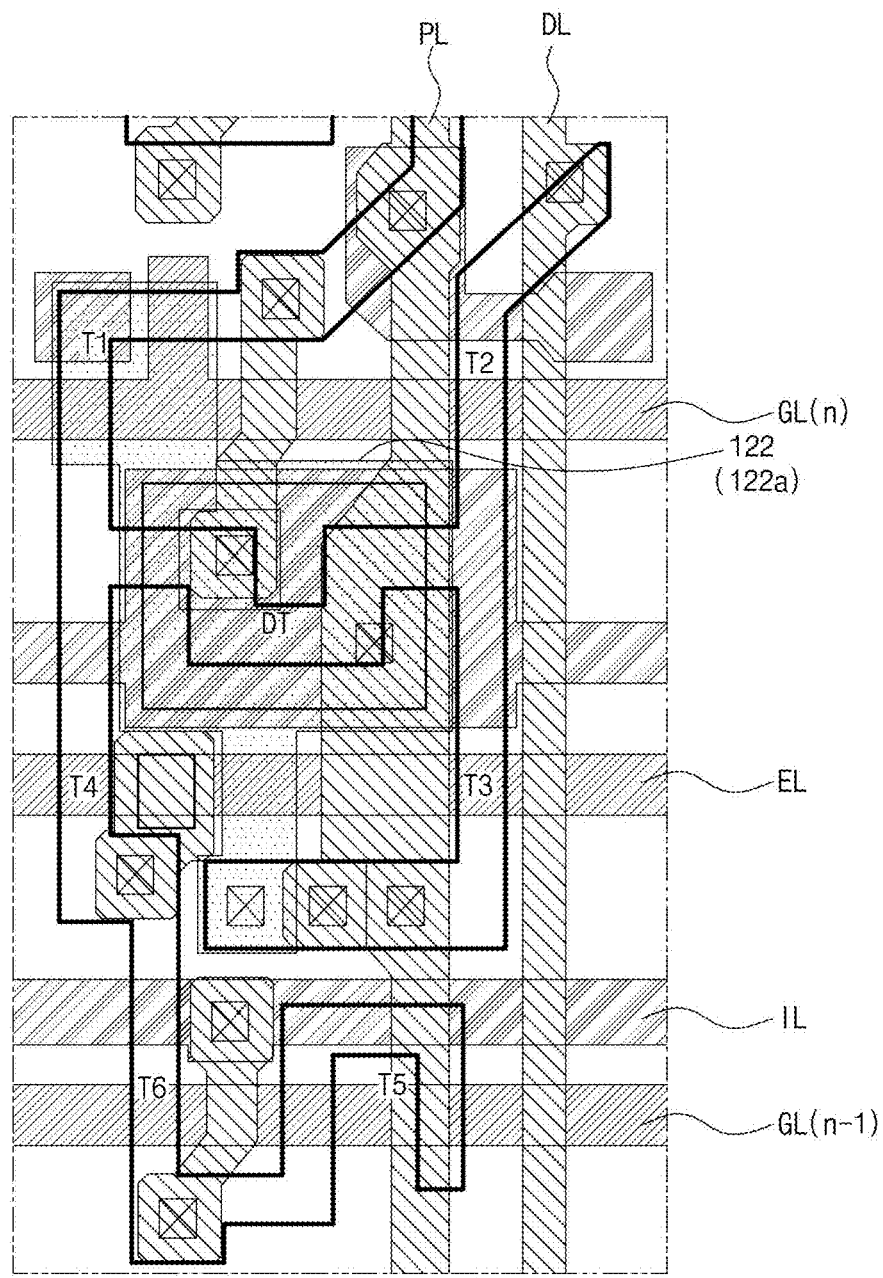
FIG. 9 is a plan view schematically illustrating the sub-pixel of the display panel in the non-folding region of the foldable display device according to the embodiment of the present disclosure.
Figure 10:
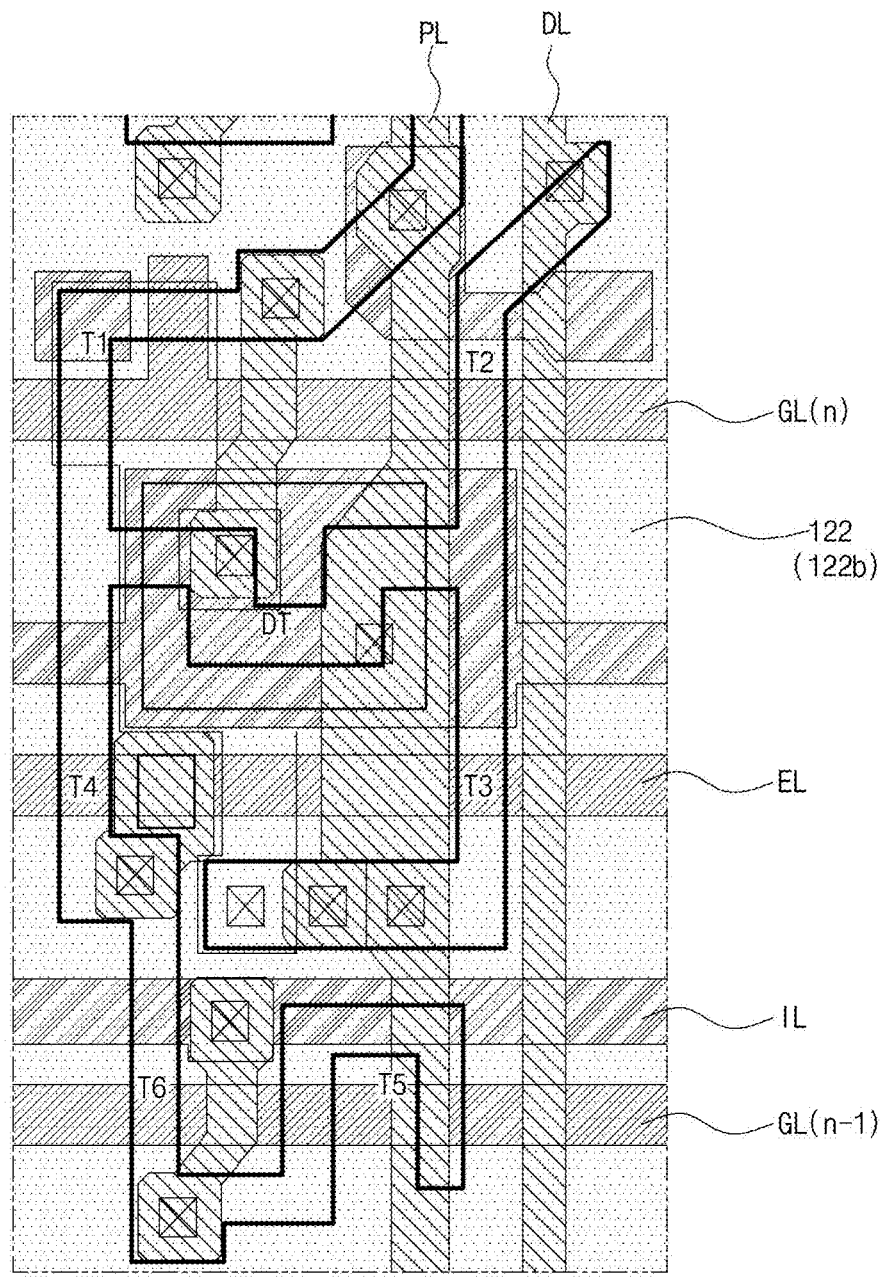
FIG. 10 is a plan view schematically illustrating the sub-pixel of the display panel in the folding region of the foldable display device according to the embodiment of the present disclosure.

FIG. 7 is a circuit diagram illustrating a sub-pixel of the display panel in the non-folding region of the foldable display device according to the embodiment of the present disclosure, FIG. 8 is a circuit diagram illustrating a sub-pixel of the display panel in the folding region of the foldable display device according to the embodiment of the present disclosure, and FIG. 7 and FIG. 8 also show the first and second shield patterns, respectively. In addition, FIG. 9 is a plan view schematically illustrating the sub-pixel of the display panel in the non-folding region of the foldable display device according to the embodiment of the present disclosure, and FIG. 10 is a plan view schematically illustrating the sub-pixel of the display panel in the folding region of the foldable display device according to the embodiment of the present disclosure.

In FIGS. 7 to 10, each sub-pixel of the display panel of the foldable display device according to the embodiment of the present disclosure includes a driving transistor DT, first, second, third, fourth, fifth, and sixth transistors T1, T2, T3, T4, T5, and T6, a storage capacitor Cst, and a light-emitting diode De.

For example, the driving transistor DT and the first, second, third, fourth, fifth, and sixth transistors T1, T2, T3, T4, T5, and T6 can be P-type. However, the present disclosure is not limited thereto. Alternatively, the driving transistor DT and the first, second, third, fourth, fifth, and sixth transistors T1, T2, T3, T4, T5, and T6 can be N-type.

Here, the driving transistor DT can be connected to first, second, and third nodes N1, N2, and N3, the storage capacitor Cst can be connected to the second node N2 and a high potential voltage VDD, and the light-emitting diode De can be connected to a fourth node N4 and a low potential voltage VSS.

The driving transistor DT is switched according to a voltage of a first electrode of the storage capacitor Cst, that is, the second node N2, and each of the first, second, third, fourth, fifth, and sixth transistors T1, T2, T3, T4, T5, and T6 is switched according to one of an nth gate voltage Scan(n), an (n−1)th gate voltage Scan(n−1), and an emission voltage EM. Here, n is a natural number.

Specifically, the driving transistor DT can be switched according to the voltage of the first electrode of the storage capacitor Cst. A gate electrode of the driving transistor DT can be connected to the first electrode of the storage capacitor Cst, a drain electrode of the first transistor T1, and a source electrode of the fifth transistor T5. A source electrode of the driving transistor DT can be connected to a drain electrode of the second transistor T2 and a source electrode of the third transistor T3. A drain electrode of the driving transistor DT can be connected to a source electrode of the first transistor T1 and a source electrode of the fourth transistor T4.

The first transistor T1 can be switched according to the nth gate voltage Scan(n). A gate electrode of the first transistor T1 can be connected to an nth gate line GL(n) to receive the nth gate voltage Scan(n). The source electrode of the first transistor T1 can be connected to the drain electrode of the driving transistor DT and the source electrode of the fourth transistor T4. The drain electrode of the first transistor T1 can be connected to the first electrode of the storage capacitor Cst, the gate electrode of the driving transistor DT, and the source electrode of the fifth transistor T5.

The second transistor T2, which is a switching transistor, can be switched according to the nth gate voltage Scan(n) to transmit a data voltage Vdata. A gate electrode of the second transistor T2 can be connected to the nth gate line GL(n) to receive the nth gate voltage Scan(n). A source electrode of the second transistor T2 can be connected to a data line DL to transmit the data voltage Vdata. The drain electrode of the second transistor T2 can be connected to the source electrode of the driving transistor DT and the source electrode of the third transistor T3.

The third transistor T3 can be switched according to the emission voltage EM. A gate electrode of the third transistor T3 can be connected to an emission line EL to receive the emission voltage EM. The source electrode of the third transistor T3 can be connected to the source electrode of the driving transistor DT and the drain electrode of the second transistor T2. A drain electrode of the third transistor T3 can be connected to a second electrode of the storage capacitor Cst and connected to a power line PL to receive a high potential voltage VDD.

The fourth transistor T4 can be switched according to the emission voltage EM. A gate electrode of the fourth transistor T4 can be connected to the emission line EL to receive the emission voltage EM. The source electrode of the fourth transistor T4 can be connected to the drain electrode of the driving transistor DT and the source electrode of the first transistor T1. A drain electrode of the fourth transistor T4 can be connected to an anode of the light-emitting diode De.

The fifth transistor T5 can be switched according to the (n−1)th gate voltage Scan(n−1). A gate electrode of the fifth transistor T5 can be connected to an (n−1)th gate line GL(n−1) to receive the (n−1)th gate voltage Scan(n−1). The source electrode of the fifth transistor T5 can be connected to the gate electrode of the driving transistor DT, the first electrode of the storage capacitor Cst, and the drain electrode of the first transistor T1. A drain electrode of the fifth transistor T5 can be connected to a drain electrode of the sixth transistor T6 and connected to an initialization line IL to receive an initialization voltage Vini.

The sixth transistor T6 can be switched according to the (n−1)th gate voltage Scan(n−1). A gate electrode of the sixth transistor T6 can be connected to the (n−1)th gate line GL(n−1) to receive the (n−1)th gate voltage Scan(n−1). A source electrode of the sixth transistor T6 can be connected to the drain electrode of the fourth transistor T4 and the anode of the light-emitting diode De. The drain electrode of the sixth transistor T6 can be connected to the drain electrode of the fifth transistor T5 and connected to the initialization line IL to receive the initialization voltage Vini.

The storage capacitor Cst can be connected between the high potential voltage VDD and the driving transistor DT. In particular, the first electrode of the storage capacitor Cst can be connected to the gate electrode of the driving transistor DT, the drain electrode of the first transistor T1, and the source electrode of the fifth transistor T5. The second electrode of the storage capacitor Cst can be connected to the drain electrode of the third transistor T3 and connected to the power line PL to receive the high potential voltage VDD.

The light-emitting diode De can be connected between the fourth transistor T4 and the low potential voltage VSS to emit light with luminance proportional to a current of the driving transistor DT. The anode of the light-emitting diode De can be connected to the drain electrode of the fourth transistor T4. The cathode of the light-emitting diode De can receive the low potential voltage VSS. Further, the anode of the light-emitting diode De can be connected to the source electrode of the sixth transistor T6.

Meanwhile, in the display panel according to the embodiment of the present disclosure, the shield pattern 122 is formed to correspond to the sub-pixel. The shield pattern 122 includes the first shield pattern 122a disposed in the non-folding region and the second shield pattern 122b disposed in the folding region.

The first shield pattern 122a of the non-folding region overlaps the driving transistor DT and the first transistor T1. Alternatively, the first shield pattern 122a can overlap only the driving transistor DT.

On the other hand, the second shield pattern 122b of the folding region overlaps the driving transistor DT and the first, second, third, fourth, fifth and sixth transistors T1, T2, T3, T4, T5, and T6. In addition, the second shield pattern 122b further overlaps the storage capacitor Cst and the light-emitting diode De and also overlaps the plurality of lines GL(n), GL(n−1), DL, PL, EL, and IL.

The cross-sectional configurations of the display panel according to the embodiment of the present disclosure will be described with reference to FIG. 11 and FIG. 12.

Figure 11:
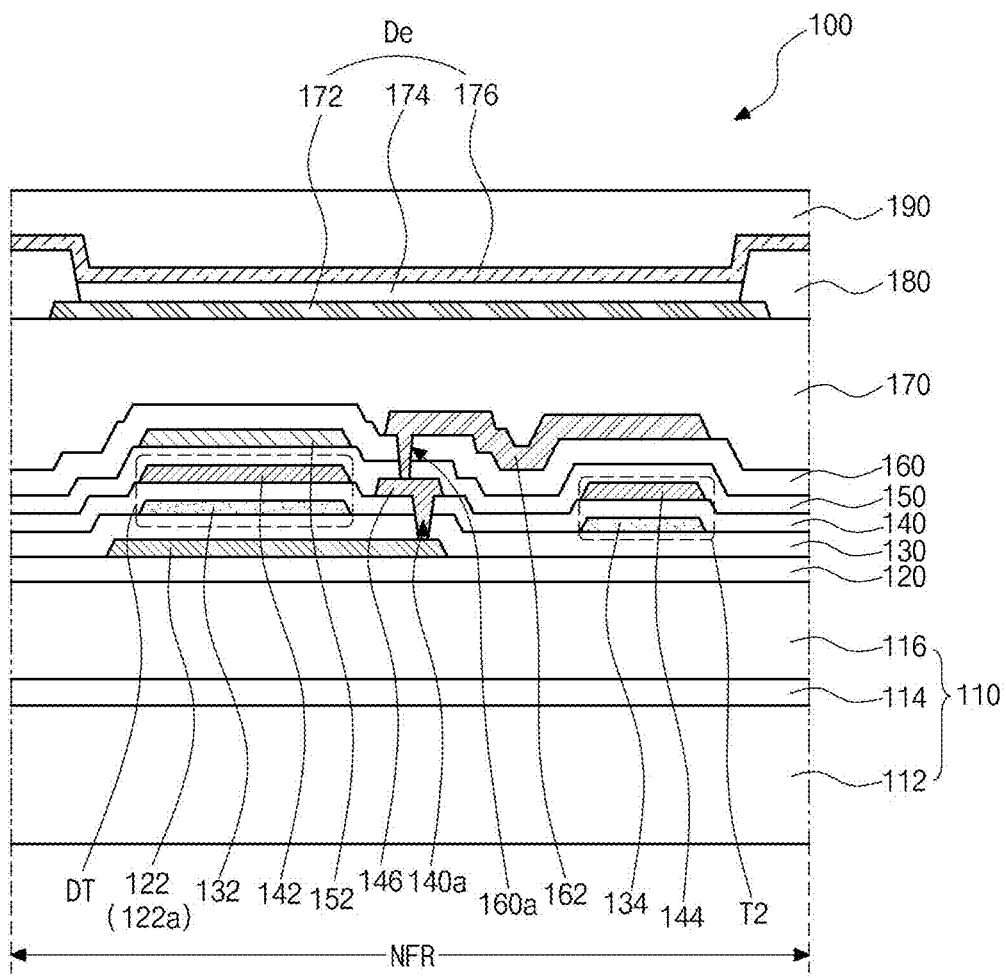
FIG. 11 is a cross-sectional view schematically illustrating the display panel in the non-folding region of the foldable display device according to the embodiment of the present disclosure.
Figure 12:
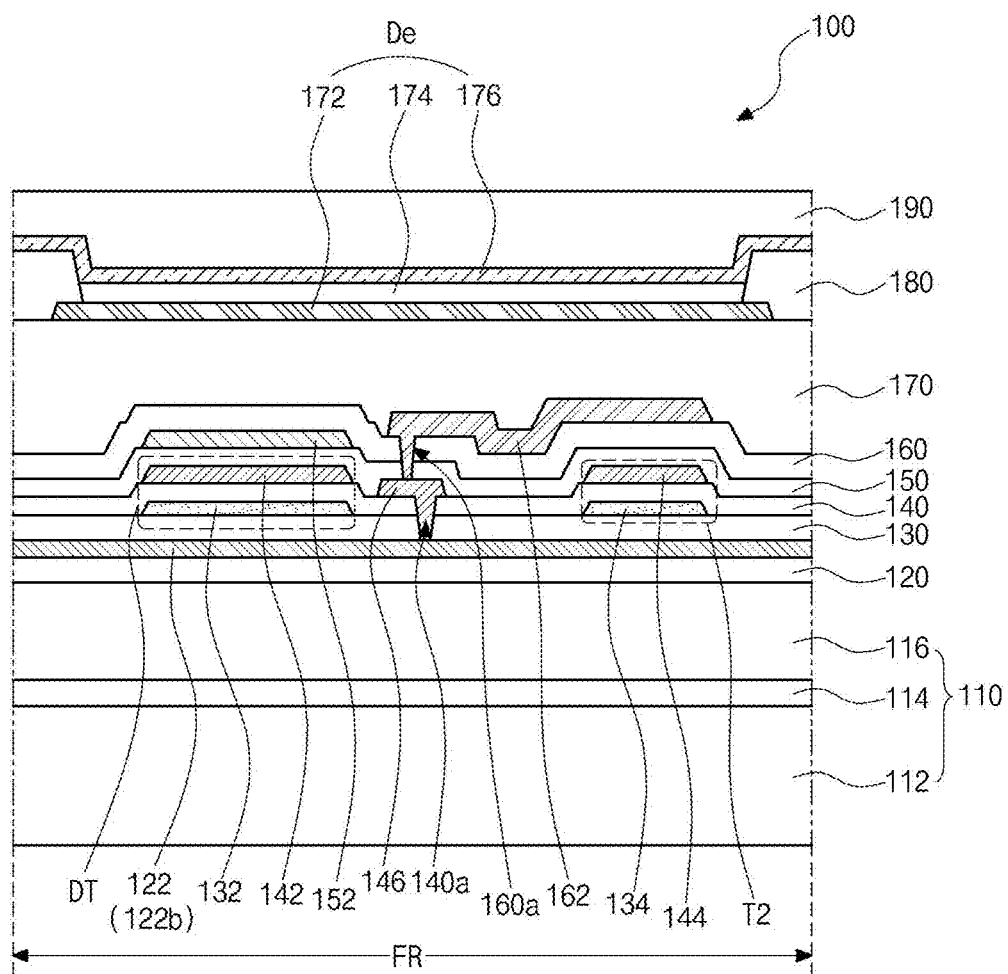
FIG. 12 is a cross-sectional view schematically illustrating the display panel in the folding region of the foldable display device according to the embodiment of the present disclosure.

FIG. 11 is a cross-sectional view schematically illustrating the display panel in the non-folding region of the foldable display device according to the embodiment of the present disclosure, and FIG. 12 is a cross-sectional view schematically illustrating the display panel in the folding region of the foldable display device according to the embodiment of the present disclosure.

In FIG. 11 and FIG. 12, the display panel 100 of the present disclosure includes the plurality of transistors DT and T2 and the light-emitting diode De on a flexible substrate 110. Here, the plurality of transistors DT and T2 can be the driving transistor DT and the second transistor T2, which is the switching transistor, of FIGS. 7 and 8.

More particularly, a first buffer layer 120 is formed on the flexible substrate 110. The flexible substrate 110 can be formed of a material having flexibility. The flexible substrate 110 can include first, second, and third base layers 112, 114, and 116 sequentially disposed from the bottom. Accordingly, the second base layer 114 can be disposed between the first and third base layers 112 and 116.

The first and third base layers 112 and 116 can be formed of an organic material, and the second base layer 114 can be formed of an inorganic material. For example, the first and third base layers 112 and 116 can be formed of polyimide, and the second base layer 114 can be formed of silicon oxide ($SiO_2$) or silicon nitride ($SiNx$).

Here, thicknesses of the first and third base layers 112 and 116 can be thicker than a thickness of the second base layer 114. In addition, the thickness of the first base layer 112 can be thicker than the thickness of the third base layer 116. That is, the thickness of the third base layer 116 can be greater than the thickness of the second base layer 114 and smaller than the thickness of the first base layer 112.

The first buffer layer 120 can be formed over substantially an entire surface of the flexible substrate 110. The first buffer layer 120 can be formed of an inorganic insulating material, such as silicon oxide ($SiO_2$) or silicon nitride (SiNx), and can have a single-layer structure or a multiple-layer structure.

The shield pattern 122 is formed on the first buffer layer 120. The shield pattern 122 includes the first shield pattern 122a disposed in the non-folding region NFR and the second shield pattern 122b disposed in the folding region FR.

In the non-folding region NFR, the first shield pattern 122a overlaps the driving transistor DT and does not overlap the second transistor T2.

Alternatively, in the folding region FR, the second shield pattern 122b overlaps the driving transistor DT and the second transistor T2.

Further, as described above, in the non-folding region NFR, the first shield pattern 122a overlaps the first transistor T1 of FIG. 7, and in the folding region FR, the second shield pattern 122b overlaps the first, third, fourth, fifth, and sixth transistors T1, T3, T4, T5, and T6 of FIG. 8.

The shield pattern 122, that is, the first and second shield patterns 122a and 122b can be formed of a metal material, for example, at least one of aluminum (Al), copper (Cu), molybdenum (Mo), chromium (Cr), nickel (Ni), tungsten (W), or their alloys and can have a single-layer structure or a multiple-layer structure.

A second buffer layer 130 is formed on the first and second shield patterns 122a and 122b over substantially the entire surface of the flexible substrate 110. The second buffer layer 130 can be formed of an inorganic insulating material, such as silicon oxide ($SiO_2$) or silicon nitride (SiNx), and can have a single-layer structure or a multiple-layer structure.

First and second semiconductor layers 132 and 134 are formed on the second buffer layer 130. In the non-folding region NFR, the first semiconductor layer 132 is disposed right over the first shield pattern 122a and overlaps the first shield pattern 122a, and the second semiconductor layer 134 is spaced apart from the first shield pattern 122a and does not overlap the first shield pattern 122a. On the other hand, in the folding region FR, the first and second semiconductor layers 132 and 134 are disposed right over the second shield pattern 122b and overlap the second shield pattern 122b.

The first and second semiconductor layers 132 and 134 can be formed of an oxide semiconductor material. Alternatively, the first and second semiconductor layers 132 and 134 can be formed of polycrystalline silicon.

A gate insulation layer 140 is formed on the first and second semiconductor layers 132 and 134 over substantially the entire surface of the flexible substrate 110. The gate insulation layer 140 can be formed of an inorganic insulating material, such as silicon oxide ($SiO_2$) or silicon nitride (SiNx), and can have a single-layer structure or a multiple-layer structure.

The gate insulation layer 140 and the second buffer layer 130 have a first contact hole 140a exposing the shield pattern 122, that is, each of the first and second shield patterns 122a and 122b, thereunder.

First and second gate electrodes 142 and 144 are formed on the gate insulation layer 140. The first gate electrode 142 is disposed right over the first semiconductor layer 132 and overlaps the first semiconductor layer 132. The second gate electrode 144 is disposed right over the second semiconductor layer 134 and overlaps the second semiconductor layer 134. The first and second gate electrodes 142 and 144 can be formed of a metal material, for example, at least one of aluminum (Al), copper (Cu), molybdenum (Mo), chromium (Cr), nickel (Ni), tungsten (W), or their alloys and can have a single-layer structure or a multiple-layer structure.

A connection pattern 146 is formed on the gate insulation layer 140. The connection pattern 146 can be formed of the same material as the first and second gate electrodes 142 and 144. The connection pattern 146 is in direct contact with the shield pattern 122 through the first contact hole 140a.

A first interlayer insulation layer 150 is formed on the first and second gate electrodes 142 and 144 and the connection pattern 146 over substantially the entire surface of the flexible substrate 110. The first interlayer insulation layer 150 can be formed of an inorganic insulating material, such as silicon oxide ($SiO_2$) or silicon nitride (SiNx).

A capacitor electrode 152 of a metal material is formed on the first interlayer insulation layer 150. The capacitor electrode 152 can overlap the first gate electrode 142.

A second interlayer insulation layer 160 is formed on the capacitor electrode 152 over substantially the entire surface of the flexible substrate 110. The second interlayer insulation layer 160 can be formed of an inorganic insulating material, such as silicon oxide ($SiO_2$) or silicon nitride (SiNx).

The second interlayer insulation layer 160 and the first interlayer insulation layer 150 have a second contact hole 160a exposing the connection pattern 146 thereunder.

A power line 162 of a metal material is formed on the second interlayer insulation layer 160. The power line 162 is in direct contact with the connection pattern 146 through the second contact hole 160a. Accordingly, the power line 162 is electrically connected to the shield pattern 122 through the connection pattern 146.

The power line 162 can overlap the second gate electrode 144 and can be spaced apart from the first gate electrode 142.

In addition, although not shown in the figure, first source and first drain electrodes and second source and second drain electrodes are further formed on the second semiconductor layer 134. The first source and first drain electrodes and second source and second drain electrodes can be formed of the same material as the power line 162.

The first semiconductor layer 132, the first gate electrode 142, and the first source and first drain electrodes constitute the driving transistor DT. The second semiconductor layer 134, the second gate electrode 144, and the second source and second drain electrodes constitute the second transistor T2.

A planarization layer 170 is formed on the power line 162. The planarization layer 170 is formed over substantially the entire surface of the flexible substrate 110 and has a flat top surface, thereby removing step differences due to the layers thereunder. The planarization layer 170 can be formed of an organic insulating material. For example, the organic insulating material can be photo acryl, but is not limited thereto.

A first electrode 172 is formed on the planarization layer 170. The first electrode 172 can be formed of a conductive material having relatively high work function. For example, the first electrode 172 can be formed of a transparent conductive material, such as indium tin oxide (ITO) or indium zinc oxide (IZO).

In addition, the first electrode 172 can further include a reflection layer. For example, the reflection layer can be formed of aluminum-palladium-copper (APC) alloy, but is not limited thereto.

A bank layer 180 is formed on the first electrode 172. The bank layer 180 covers edges of the first electrode 172 and exposes a central portion of the first electrode 172. The bank layer 180 can be formed of an organic insulating material.

A light-emitting layer 174 is formed on the first electrode 172 exposed by the bank layer 180.

Although not shown in the figure, the light-emitting layer 174 can include a hole auxiliary layer, a light-emitting material layer, and an electron auxiliary layer sequentially stacked from a top surface of the first electrode 172. The hole auxiliary layer can include at least one of a hole injecting layer (HIL) and a hole transporting layer (HTL). The electrode auxiliary layer can include at least one of an electron transporting layer (ETL) and an electrode injecting layer (EIL).

A second electrode 176 is formed on the light-emitting layer 174. The second electrode 176 covers the bank layer 180. The second electrode 176 can be formed over substantially the entire surface of the flexible substrate 110 and can be in contact with top and side surfaces of the bank layer 180. The second electrode 176 can be formed of a conductive material having relatively low work function. For example, the second electrode 176 can be formed of aluminum (Al), magnesium (Mg), silver (Ag), or an alloy thereof, but is not limited thereto.

The first electrode 172, the light-emitting layer 174, and the second electrode 176 constitute the light-emitting diode De.

An encapsulation layer 190 is formed on the second electrode 176 over substantially the entire surface of the flexible substrate 110. The encapsulation layer 190 can be formed of an organic layer, an inorganic layer, or organic and inorganic layers alternately stacked.

As described above, in the foldable display device according to the embodiment of the present disclosure, the second shield pattern 122b is formed over substantially the whole of each sub-pixel of the folding region FR, thereby improving the durability. On the other hand, the first shield pattern 122a is formed only in a portion of each sub-pixel of the non-folding region NFR, so that it is possible to prevent deterioration of the driving characteristics due to the parasitic capacitance.

Here, in each sub-pixel, when the threshold voltages Vth of the driving transistor DT and the first transistor T1 are changed, the current variability of the light-emitting diode De is large. However, even if the threshold voltages Vth of the second, third, fourth, fifth, and sixth transistors T2, T3, T4, T5, and T6 are changed, the current variability of the light-emitting diode De is not large.

Accordingly, the first shield pattern 122a of the non-folding region NFR is formed to overlap the driving transistor DT and the first transistor T1 of each sub-pixel.

On the other hand, as described above, the second shield pattern 122b of the folding region FR is formed over substantially the whole of each sub-pixel and overlaps the driving transistor DT and the first, second, third, fourth, fifth, and sixth transistors T1, T2, T3, T4, T5, and T6 of each sub-pixel.

Table 1 shows data of the parasitic capacitance of the data line (Data Line Cap.) and data rising time in the foldable display device according to the embodiment of the present disclosure and shows data of a foldable display device according to the comparative example together. Here, in the foldable display device according to the comparative example, the shield pattern is formed over substantially the entire surface of the non-folding region as well as the folding region.

TABLE 1

|  | Embodiment | Comparative example | Decrease rate |
| --- | --- | --- | --- |
| Data Line Cap. | 75.183 pF | 100.35 pF | 25.07% |
| Data Rising Time | 0.298 μs | 0.390 μs | 23.69% |

As shown in Table 1, it can be seen that the parasitic capacitance of the data line in the embodiment of the present disclosure is decreased by about 25.07% compared to the comparative example, and thus, the data rising time is also decreased by 23.69%.

Accordingly, in the present disclosure, the shield pattern is designed differently in the folding region and the non-folding region, so that it is possible to prevent deterioration of the driving characteristics due to the parasitic capacitance.

Meanwhile, a change in characteristics of the transistors according folding evaluation will be described with reference to Table 2.

Table 2 shows the fluctuation range ΔVth of the threshold voltage Vth of the driving transistor DT and the switching transistor ST with respect to the presence or absence of the shield pattern thereunder, and shows data according to the radius of curvature and the number of foldings. Here, a smaller radius of curvature means more folding, and the switching transistor ST corresponds to the second transistor T2 of FIG. 7 and FIG. 8.

TABLE 2

| | Radius of curvature | | | | | | | |
| --- | --- | --- | --- | --- | --- | --- | --- | --- |
| | 3.0R | | | | 4.0R | | | |
| | Number of foldings | | | | | | | |
| | 50,000 times | | 100,000 times | | 50,000 times | | 100,000 times | |
| | Presence/absence of pattern | | | | | | | |
| | ○ | X | ○ | X | ○ | X | ○ | X |
| DT(ΔVth) | 0.008 | −0.156 | 0.133 | −0.604 | −0.005 | 0.112 | 0.000 | −0.360 |
| ST(ΔVth) | −0.000 | −0.088 | 0.019 | −0.347 | 0.041 | −0.043 | 0.005 | −0.085 |

As shown in Table 2, it can be seen that the threshold voltage fluctuation range of the driving transistor DT is larger than that of the switching transistor ST.

In addition, it can be seen that the threshold voltage fluctuation range of the driving transistor DT increases as the radius of curvature decreases and increases as the number of foldings increases.

Meanwhile, it can be seen that the threshold voltage fluctuation range of the driving transistor DT is very small when there is the shield pattern thereunder compared to the case where there is no shield pattern thereunder.

As described above, in the present disclosure, the shield pattern is designed differently in the folding region and the non-folding region. That is, the first shield pattern is formed under the driving transistor DT of the non-folding region, and the second shield pattern is formed over substantially the entire surface of the folding region. Accordingly, it is possible to improve the durability in the folding region and to prevent deterioration of the driving characteristics due to the parasitic capacitance in the non-folding region.

Further, the plurality of openings is provided in the folding region of the plate bottom for improving the durability and maintaining the shape, so that the folding characteristics can be improved.

It will be apparent to those skilled in the art that various modifications and variations can be made in the foldable display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A foldable display device, comprising:
    a display panel including a plurality of sub-pixels and having a first shield pattern in a non-folding region and a second shield pattern in a folding region; and
    a cover window over the display panel,
    wherein an area of the second shield pattern is larger than an area of the first shield pattern,
    wherein each of the plurality of sub-pixels includes a first transistor and a second transistor,
    wherein the first shield pattern overlaps the first transistor and is spaced apart from the second transistor, and
    wherein the second shield pattern overlaps the first transistor and the second transistor.

2. The foldable display device of claim 1, wherein the first shield pattern corresponds to one of the plurality of sub-pixels in the non-folding region, and the second shield pattern corresponds to all of the plurality of sub-pixels in the folding region.

3. The foldable display device of claim 1, wherein each of the plurality of sub-pixels includes a plurality of transistors including the first and second transistors, a storage capacitor, and a light-emitting diode, and
    wherein the first shield pattern overlaps some of the plurality of transistors including the first transistor, and the second shield pattern overlaps all of the plurality of transistors including the first and second transistors.

4. The foldable display device of claim 1, wherein the plurality of transistors includes a driving transistor and third, fourth, fifth, and sixth transistors, and the first transistor is connected to a gate electrode and a drain electrode of the driving transistor, and
    wherein the first shield pattern overlaps the driving transistor and the first transistor, and the second shield pattern overlaps the driving transistor and the first, second, third, fourth, fifth, and sixth transistors.

5. The foldable display device of claim 4, wherein the second shield pattern further overlaps the storage capacitor and the light-emitting diode.

6. The foldable display device of claim 1, further comprising a plate bottom disposed under the display panel,
    wherein the plate bottom has a plurality of openings in the folding region.

7. The foldable display device of claim 6, wherein each of the plurality of openings has a first length of a first direction and a second length of a second direction greater than the first length, and
    wherein the foldable display device is configured to be folded along the first direction.

8. The foldable display device of claim 6, wherein the display panel includes a display area where the plurality of sub-pixels is disposed to display an image and a non-display area surrounding the display area, and
    wherein the plurality of openings is disposed in the display area of the folding region and in the non-display area.

9. The foldable display device of claim 8, wherein a gate driving part is provided in the non-display area of the display panel, and
    wherein the plurality of openings overlaps the gate driving part.

10. The foldable display device of claim 9, wherein the second shield pattern overlaps the gate driving part.

11. The foldable display device of claim 6, further comprising:
    a back plate between the display panel and the plate bottom; and
    a plate top between the back plate and the plate bottom.

12. The foldable display device of claim 11, further comprising:
    a polarizing plate between the display panel and the cover window; and
    a decoration film between the polarizing plate and the cover window.

13. The foldable display device of claim 1, wherein the first and second shield patterns are formed of a metal material.

14. The foldable display device of claim 13, wherein the first and second shield patterns are electrically connected to a power line.

* * * * *